United States Patent [19]

Fancher

[11] Patent Number: 4,670,663

[45] Date of Patent: Jun. 2, 1987

[54] GUARDED SWITCHES FOR COMPONENT SCANNER

[75] Inventor: James E. Fancher, Edmonds, Wash.

[73] Assignee: John Fluke Mfg. Co., Inc., Everett, Wash.

[21] Appl. No.: 675,638

[22] Filed: Nov. 28, 1984

[51] Int. Cl.⁴ .................................... H01H 67/00
[52] U.S. Cl. .................... 307/113; 307/115; 307/125; 324/99 D; 324/123 C
[58] Field of Search ............ 307/112, 113, 115, 125; 324/99 D, 98, 123 R, 123 C

[56] References Cited

U.S. PATENT DOCUMENTS

| | | | |
|---|---|---|---|
| 3,464,012 | 8/1969 | Webb | 324/115 |
| 4,190,776 | 2/1980 | Podboronov et al. | 307/112 |
| 4,315,211 | 2/1982 | Walsh | 324/123 R |
| 4,375,616 | 3/1983 | Keller et al. | 324/99 D |
| 4,484,086 | 11/1984 | Köppl | 307/112 |

FOREIGN PATENT DOCUMENTS 535618 11/1976 U.S.S.R. .................................. 307/113

Primary Examiner—A. D. Pellinen
Assistant Examiner—Derek S. Jennings
Attorney, Agent, or Firm—Stephen A. Becker

[57] ABSTRACT

A test voltage is applied through an array of "guarded" switches (58) to selected ones of a plurality of components to be measured. Each switch (58) comprises first and second input terminals (69, 72), first and second output terminals (70, 74), and a wire (76) interconnecting the second input and second output terminals (72, 74). The switch (58) is operable selectively in a first state interconnecting its first input and output terminals (69, 70) and in a second state interconnecting the second input and output terminals (72, 74). A buffer amplifier (88) couples the input signal from the first input terminal (69) to the wire (76) interconnecting the second and output terminals (72, 74) of the switch (58) as a "guard voltage" to prevent loading of the input signal by leakage resistances within the switch.

8 Claims, 6 Drawing Figures

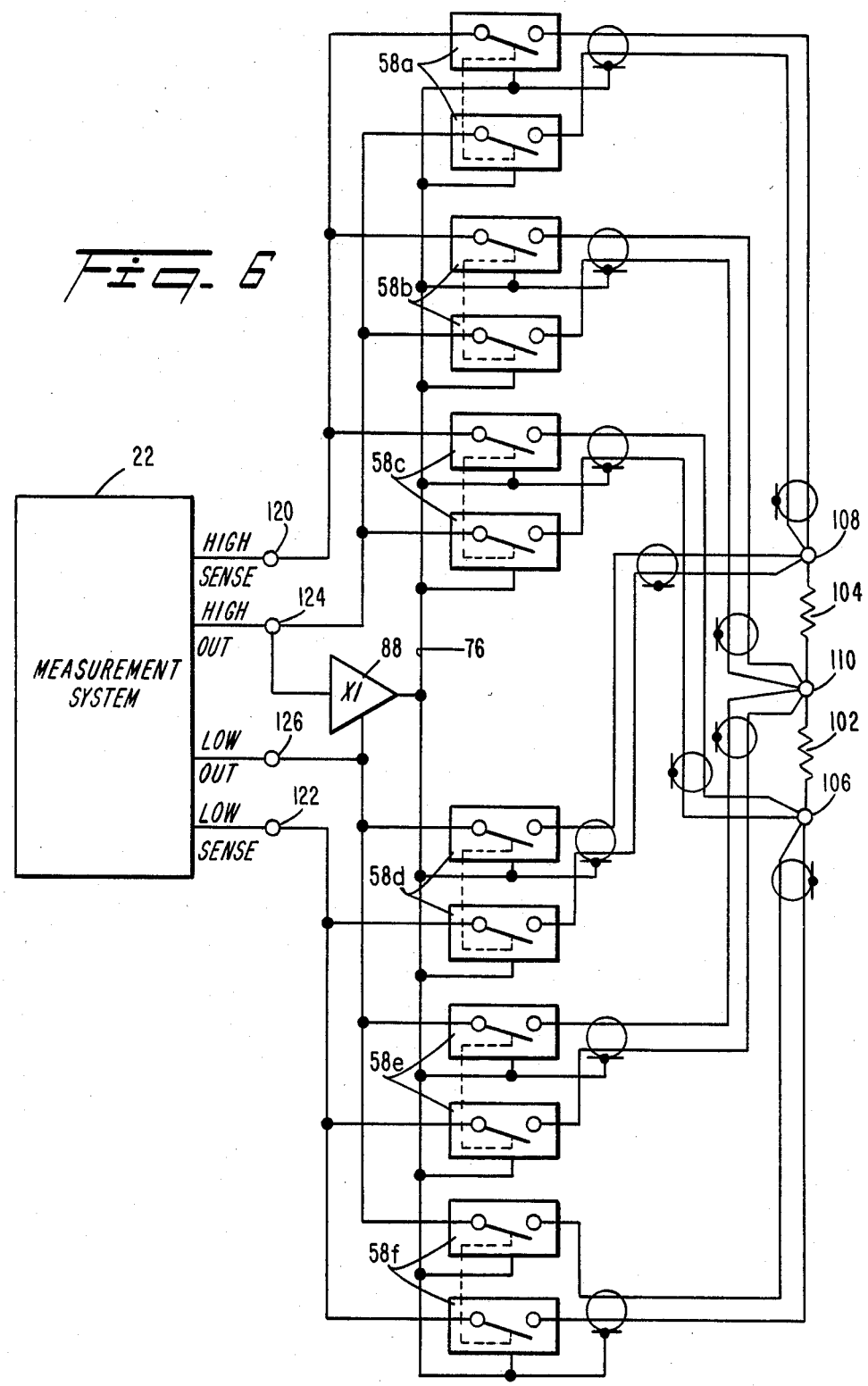

GUARDED SWITCHES FOR COMPONENT SCANNER

TECHNICAL FIELD

The invention relates generally to switching circuits, and more particularly toward guarded switches wherein loading of input signals by leakage resistances within the switches is eliminated.

BACKGROUND ART

Electrical systems commonly require measurement of resistances or of other parameters associated with resistors or other components within a circuit. In thick or thin film circuit fabrication, for example, arrays of inter-connected resistances are monitored, one by one, to determine whether the resistance values are within tolerance limits or to control trimming. Test voltages are applied selectively to the components to be tested through a bank of relay contacts, preferably within frame-type relays, but alternatively within reed, solid state or other type relays. Selective closing of the relay contacts is controlled by a central controller, depending upon the particular component under test and the polarity of voltage to be applied across that component.

Leakage resistance inherent across the terminals of each pair of open contacts is extremely high, on the order of hundreds of megohms. These leakage resistances, despite being extremely high in magnitude, tend to add a significant amount of error to high impedance measurements, e.g., on the order of tens of megohms and higher, particularly when several switches are connected simultaneously to the component being measured.

A principal object of the invention, therefore, is to eliminate the effect of inter-contact leakage in switches.

Another object is to provide a component scanner using an array of switches wherein the effects of leakage resistances within the switches are eliminated.

A further object of the invention is to provide, in a component scanner or other circuit involving signal path switching, at least one switch that is "guarded" by the input signal to eliminate effects of leakage resistance within the switch.

An additional object is more generally to improve the accuracy of high impedance measurements by eliminating the effect of open circuit leakage resistances in measurement circuitry.

DISCLOSURE OF INVENTION

The above and other objects are achieved, in accordance with the invention, by a switching circuit comprising first and second input terminals, first and second output terminals and first means for interconnecting the second input and second output terminals. Switch means within the switching circuit is selectively operable in a first state interconnecting the first input terminal and the first output terminal and in a second state interconnecting the second input terminal and the second output terminal. The input signal on the first input terminal is coupled to the first means as a "guard" signal to eliminate loading of the first and second input and output terminals by open circuit leakage resistances inherent in the switch means.

Preferably, the second coupling means includes a buffer amplifier connected between the first input terminal and the first means to minimize loading of the input terminal by an extremely high input impedance (hundreds of megohms) of the buffer. Any leakage current that flows within the switch is supplied by the buffer amplifier, rather than by the input signal, to prevent input loading.

As a further aspect of the invention, the switch means may include a single pole, double throw switch, and may further comprise a relay.

In accordance with a still further aspect of the invention, the guarded switching circuit described above may be incorporated within a component scanner circuit, wherein a plurality of switching means interconnects a signal source and a number of components to be tested. Signals from the signal source are applied, selectively, through the switching means to the components, and responses through the switching means are measured. The guard signals are applied to all the switching means by a single buffer coupled to the input terminal of the scanner.

Still other objects and advantages of the present invention will become readily apparent to those skilled in this art from the following detailed description, wherein I have shown and described only the preferred embodiments of the invention, simply by way of illustration of the best modes contemplated by me of carrying out my invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 6 is a schematic diagram of a four wire scanner circuit incorporating the principals of the present invention.

BEST MODE FOR PRACTICING THE INVENTION

Figure 1:
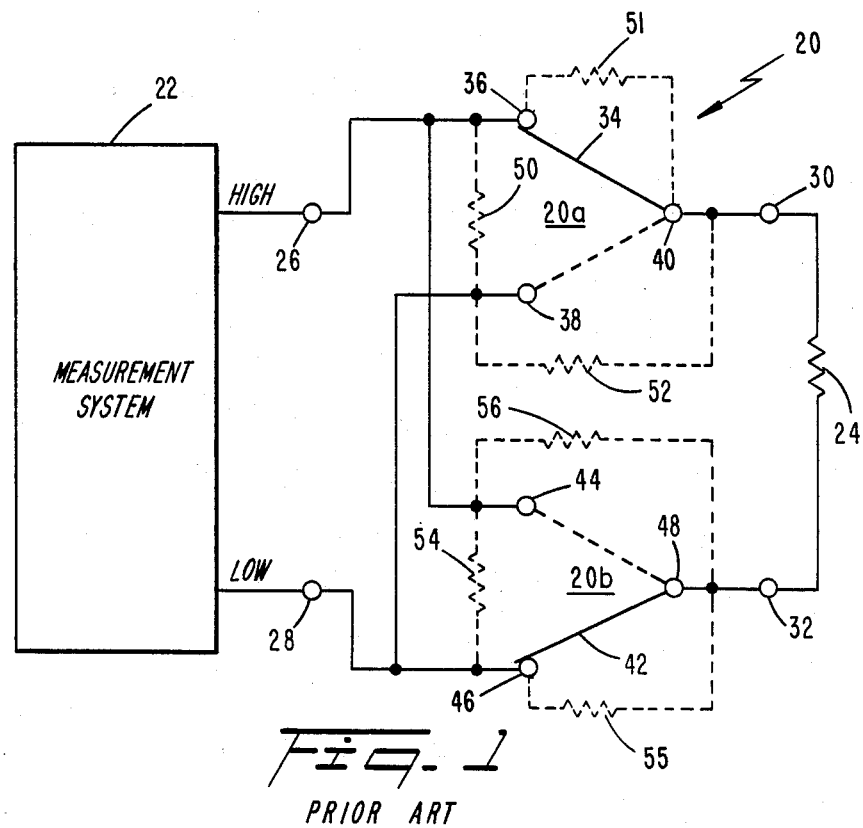
FIG. 1 is a schematic diagram showing a pair of single pole, double throw switches with internal open circuit leakage resistances, connected to apply a measurement voltage having either of opposite polarities to a component, in accordance with the prior art.

Referring to FIG. 1, a pair 20 of conventional single pole, double throw switches 20a, 20b is connected to apply either polarity of a voltage developed by a measurement system or other voltage source 22 to a load component 24. In the example shown in FIG. 1, the source is presumed to be a measurement system such as a volt-ohmmeter (one example is a Fluke 8500 Series digital volt meter) that applies a current through load resistor 24 and measures the voltage that results to obtain resistance. Switch 20 may alternatively be connected between any other type of signal source and load for selectively coupling the two together.

In a common application of this type of circuit, resistance magnitudes of thick film resistors are measured very precisely to determine whether each resistor is within tolerance limits or to trim each resistor to a precise resistance value. There are, however, open circuit leakage resistances across each of the several pairs of switch terminals which, although extremely high, are finite and have a tendency to degrade the accuracy of the measurement, particularly when high magnitude resistances, e.g., on the order of tens of megohms or more, are being measured.

Thus, in FIG. 1, measurement system 22 has a pair of "high" and "low" output terminals 26 and 28, respectively, to be coupled through switches 20 to the "high" and "low" terminals 30, 32 of load resistor 24. Switches 20 are a pair of single pole, double throw switches 20a, 20b, mechanically or electrically ganged together (not shown) to connect the output terminals 26, 28 of the source 22 to the terminals 30, 32 of load 24 with either of opposite polarities. A first switch operator 34 has a common terminal 40 and is operable in a first state shown in a solid line connected to terminal 36 and in a second state shown in a dotted line connected to terminal 38. Similarly, switch operator 42, ganged to operator 34, has a common terminal 48 and is operative in a first state shown in a solid line connected to terminal 46 and in a second state shown in a dotted line connected to terminal 44. The state of switch 20 is controlled manually by an electromagnetic coil (not shown) or by other means.

There are leakage resistances across open pairs of the switch terminals 36, 38, 40 and across 44, 46, 48. With the switch 20 positioned in the state as shown in FIG. 1, a leakage resistance 50 is across open terminals 36 and 38, a leakage resistance 52 across open terminals 38 and 40, a leakage resistance 54 is across open terminals 44 and 46 and a leakage resistance 56 is across open terminals 44 and 48. It is to be understand that resistances 50, 52, 54 and 56 represent leakage current paths across the respective open terminals, and are not component resistors. Additional leakage resistances 51 and 55 are across switch terminals 36 and 40 and across terminals 46 and 48 respectively when the switch 20 is in the opposite state.

With the switch 20 in the state shown in FIG. 1, the resistance measured by system 22 is the resistance of load resistor 24 in parallel with the leakage resistances 50, 52, 54 and 56, the parallel equivalent resistance is somewhat less than the resistance of resistor 24, and the difference becomes significant if the resistance of resistor 24 is high, e.g., within two orders of magnitude of the resistance of each leakage resistance within the switch 20.

Figure 2:
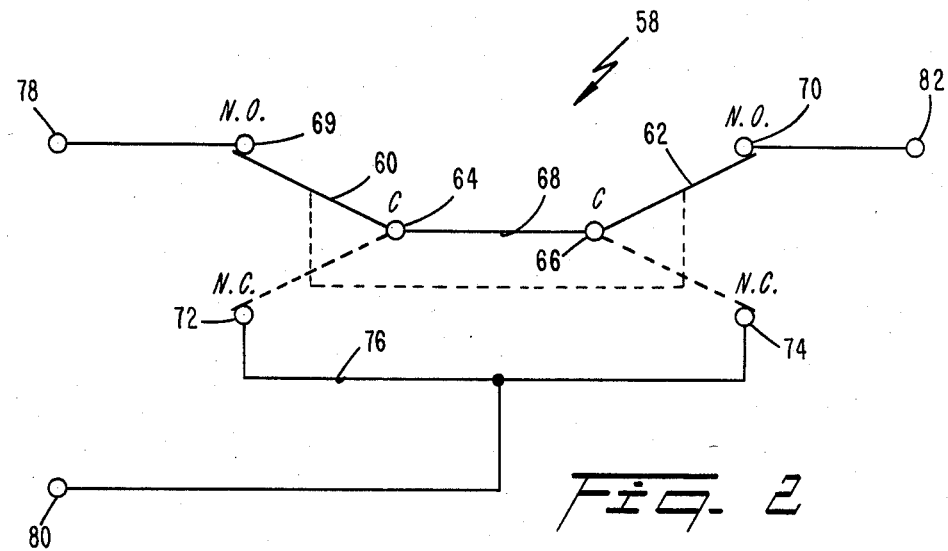
FIG. 2 is a schematic diagram of a two pole, double throw switch configured in accordance with the principals of the present invention.

FIG. 2 is a simplified diagram of a switch configuration, in accordance with the invention, to eliminate the effect of inter-terminal leakage resistances. Switch 58, which corresponds to each of the switches 20a, 20b, comprises a two pole, double throw switch 58 having a pair of switch operators 60, 62 with common terminals 64, 66 connected together by a wire 68. The switch operators 60, 62 are connectable selectively to a pair of normally open (N.O.) terminals 69, 70 and to a pair of normally closed (N.C.) terminals 72, 74. The normally closed terminals 72, 74 in turn are connected together by a wire 76. The normally open terminal 69 and wire 76 are connected respectively to input terminals 78, 80 and normally open terminal 70 is connected to output terminal 82.

With the switch 58 in the position shown in FIG. 2, an input signal at terminal 78 is coupled to output terminal 82 through switch operators 60 and 62 and wire 68. When the switch 58 is in an opposite state, that is, with switch operators 60 and 62 in contact with terminals 72 and 74, (shown by dotted line) an open circuit is established between switch terminals 69 and 70, electrically isolating input and output terminals 78 and 82.

Although not shown in FIG. 2, there are leakage resistances across open terminal pairs, i.e., across terminal pairs 69, 72 and 70, 74, and 72, 64, and 74, 66. These resistances correspond to leakage resistances 50, 52, 54 and 56 in FIG. 1. The effect of the leakage resistance in switch 58 is eliminated in accordance with the invention by applying to terminals 72, 74 a "guard" voltage that effectively electrically isolates the leakage resistances from the terminals 64, 69, 66, and 70 of the switch by preventing flow of leakage current through those resistances. The "guard" voltage, which preferably is obtained from the input voltage, has a magnitude and polarity equal to the magnitude and polarity of the input voltage, establishes equal voltages on both ends of each of the leakage resistances. A buffer amplifier 88, described below, establishes a high input impedance when the switch 58 is open, thereby eliminating any loading of the input signal.

Figure 3:
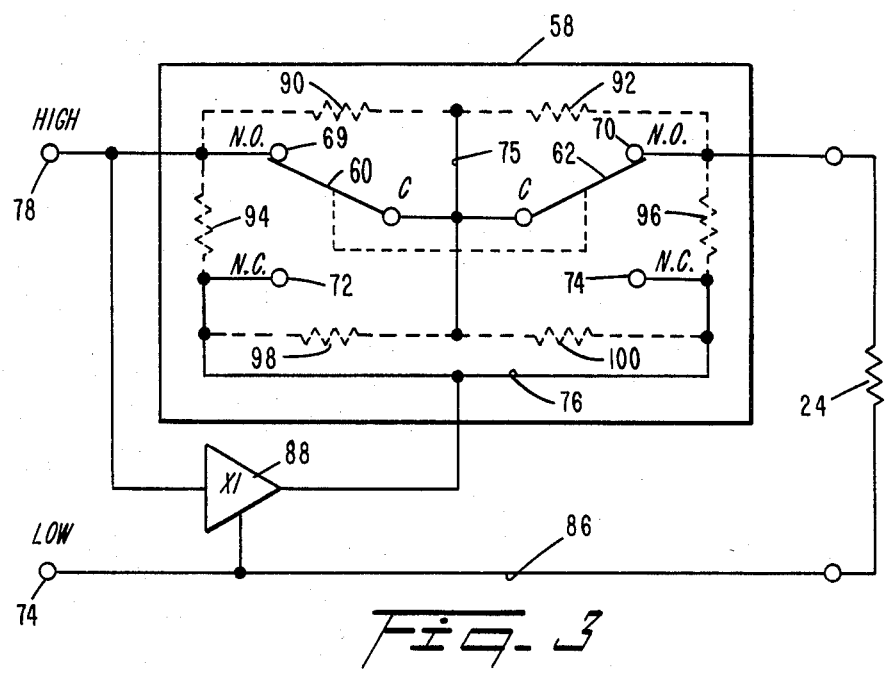
FIG. 3 is a schematic diagram of a basic switching module, in accordance with a preferred embodiment of the invention, in the positive, or "HIGH" leg of a circuit in series with a voltage source and load component.

Referring to FIG. 3, switch 58 is implemented within a circuit for applying a voltage from measurement system 22 (FIG. 1) to a resistor 24 to be tested. With the switch 58 in the "HIGH" side of the circuit and the state shown in FIG. 3, that is, with switch operator 60 connected to contact 69 and with switch operator 62 connected to contact 70, the "HIGH" voltage generated by measurement system or source 22 is applied to the upper end of resistor 24; the "low" output of the source 22 is connected directly, through wire 86, to the opposite or lower end of resistor 24. A high impedance buffer amplifier 88, such as an MOSFET voltage follower, having an extremely high input impedance, couples the signal on input terminal 78 to line 76. The buffer amplifier 88 may be either internal or external to the measurement system 22, but is shown external to clarify the function of the guarded switches.

Inherent with switch 58 are leakage resistances 90, 92, 94, 96, 98 and 100 establishing leakage current paths between the switch terminals 69, 70, 72, 74, and the common terminal 75. In accordance with the invention, however, these leakage resistances 90–100 do not load the input signal because the switch 58 is "guarded" by the output of the buffer 88. Specifically, as is apparent by inspection of FIG. 3, leakage resistors 90 and 92 are bypassed by switch operators 60 and 62. Line 76 is at the same voltage as are input terminal 69 and output terminal 70; there is therefore no flow of leakage current through leakage resistances 94 and 96. Similarly, the voltage at common line al 75 is equal to the voltage at line 76; there is therefore no current flow through leakage resistances 98 and 100. There is accordingly no loading of either input terminal 69 or output terminal 70 by leakage current, and the applied voltage passes through the switch without any loading thereof by the switch.

There is a similar result when switch 58 is in the opposite state (not shown) with operators 60 and 62 in contact respectively with terminals 72 and 74.

Figure 4:
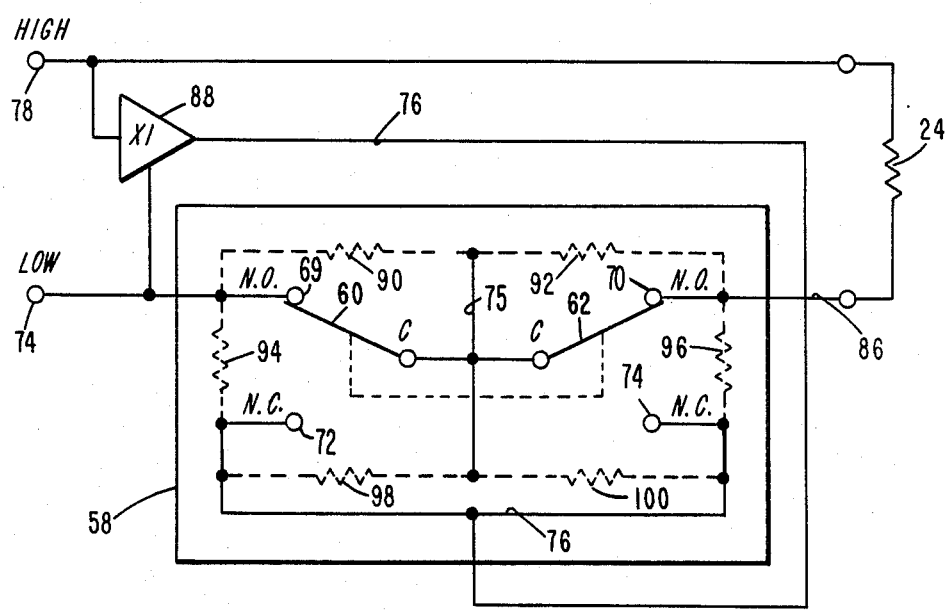
FIG. 4 is a schematic diagram of the basic switching module in accordance with the invention, in the negative, or "LOW" leg of a circuit in series with a load component.

Referring to FIG. 4, switch 58 is positioned between source 22 (not shown) and load resistor 24, in the "low" or "return" side of the circuit. With switch operators 60, 62 in the position or state shown, leakage resistances 90 and 92 are short circuited. The "HIGH" input voltage applied to the upper end of load resistor 24 is also applied, through buffer amplifier 88, to line 76 within the switch 58. The "HIGH" input signal from buffer amplifier 88 is applied by line 76 to opposite ends of leakage resistors 94, 96, 98, and 100; the remaining ends of leakage resistors 94, 96, 98, and 100 are connected through line 75 and switch operators 60, 62 to the "low" side of the input signal. Leakage current thus flows through leakage resistors 94, 96 and 98, 100. The leakage currents are supplied, however, by amplifier 88 rather than by the "HIGH" input signal. Since the input of amplifier 88, having an extremely high input impedance, does not present any measurable load on the "HIGH" input terminal of the circuit, the leakage resistances 90, 92, 94, 96, 98 and 100, inherent in switch 58, do not load or otherwise affect the input signal.

Thus, whether the switch 58 is in the "HIGH" or in the "LOW" side of the circuit, there is no loading of the input signal by leakage resistances inherent in the switch, and the accuracy of high resistance measurements, even when a number of switches in a complex network are connected in parallel, is substantially higher than is possible in the prior art.

Figure 5:
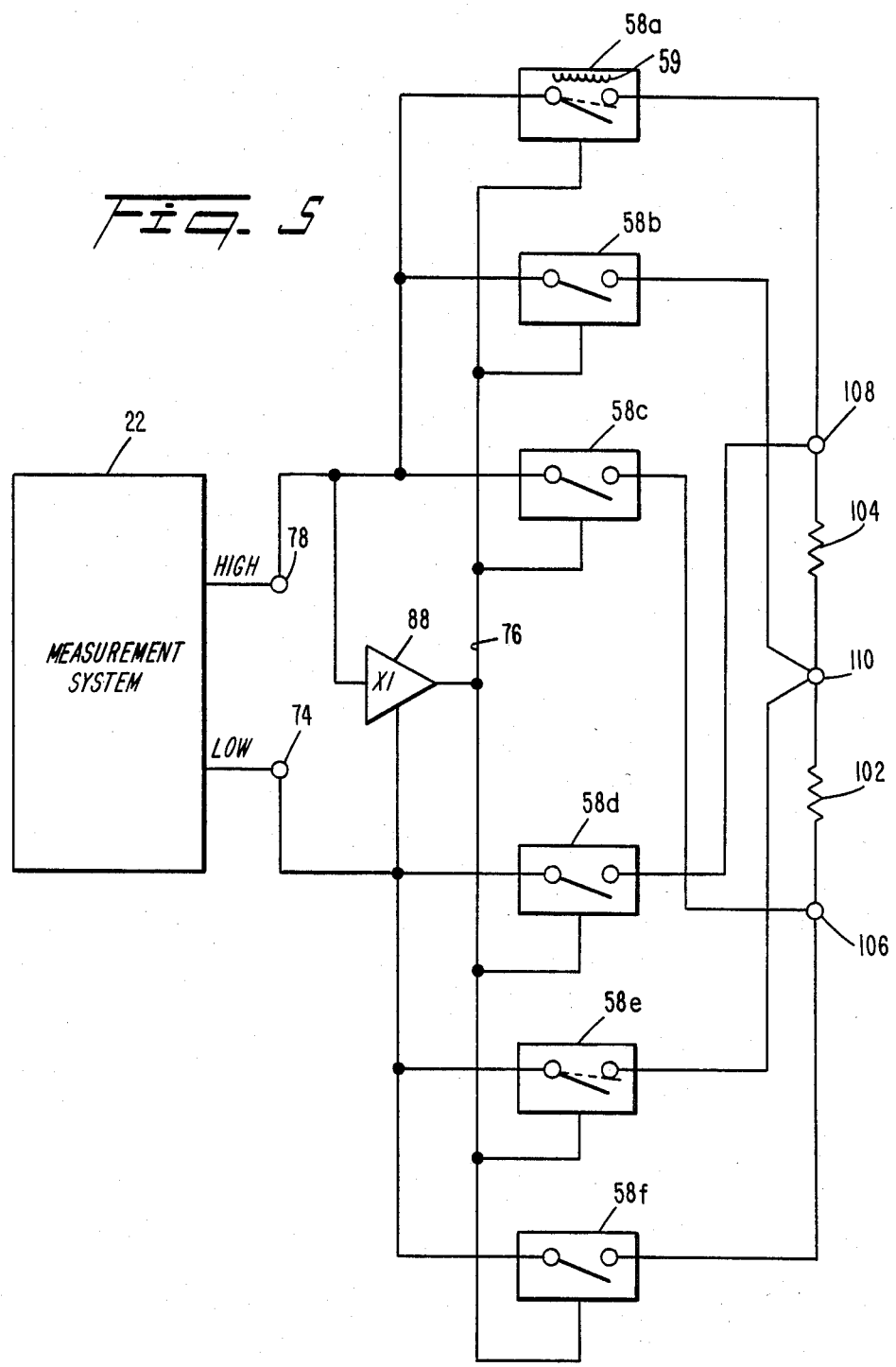
FIG. 5 is a simplified schematic diagram of a scanner circuit incorporating a number of the switches operated to apply selectively a positive or voltage across either one of a load components.

Referring now to FIG. 5, a number of switches 58a–58f, corresponding to switch 58 in FIGS. 3 and 4, are connected between measurement system 22 and a pair of load resistors 102, 104 between terminals 106, 108 and 110. The switches 58a–58f are selectively operated manually, by electromagnetic coils such as 59 or by other means to apply a voltage selectively to either of the two resistors with either of opposite polarities.

All six switches 58a–58f in FIG. 5 are open. When switches 58a and 58e are closed (shown dotted), and the remaining switches are open, however, resistor 104 is connected with a first polarity between the "HIGH" and "LOW" output terminals of measurement system 22, that is, with the "HIGH" voltage at terminal 108 and the "LOW" voltage at terminal 110.

With switches 58b and 58d closed, and the remaining switches open, load resistor 104 is connected with an opposite polarity between the "HIGH" and "LOW" terminals of measurement system 22, that is, with the "HIGH" voltage applied to terminal 110 and the "LOW" side voltage applied to terminal 108.

With switches 58b and 58f closed and the remaining switches open, resistor 102 is connected with a first polarity between the "HIGH" and "LOW" output terminals of measurement system 22, that is, with load resistor terminal 110 connected through switch 58b to measurement terminal 78 and load resistor terminal 106 connected through switch 58f to the "low" measurement terminal.

With switches 58c and 58e closed and the remaining switches open, load resistor 102 is connected with an opposite polarity between the "HIGH" and "LOW" output terminals of measurement system 22, that is, with load resistor 102 connected through switch 58c to the "HIGH" side of measurement system 22 and load resistor terminal 110 connected through switch 58e to the "LOW" side output of the measurement system.

In FIG. 6, a scanner system makes four wire measurements of any number of resistors (two resistors are shown) with either of opposite polarities. Switch pairs 58a–58f are controlled manually or preferably by electromagnetic coils (not shown) to cause high out and high sense terminals 124, 120 to be operated simultaneously with low sense and low output terminals 122, 126. The measurement system 22 shown in FIG. 6 can be generalized to scan any number of measurement terminals by providing "HIGH" and "LOW" switch pairs for each terminal of the network to be tested. Four wire measurement systems of a type that can be utilized as system 22 in FIG. 6, are well known in the prior art, e.g., Fluke 8500 Series of digital volt meters.

There has thus been described a new and improved switch applicable in component scanner systems and in other environments, wherein there is no loading of measurement signals by leakage resistances inherent in the switch. The switch, when connected in the "HIGH" side of a circuit, eliminates the effects of leakage resistances by applying to the switch a guard voltage derived by a buffer amplifier from the input voltage, thereby to effectively cancel any voltage drop across leakage resistances that would otherwise create leakage current to flow through the switch. When the switch is connected in the "LOW" side of the circuit, leakage current flowing through the leakage resistances is applied by the buffer amplifier and not by the input signal, to eliminate loading.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein. For example, although mechanical switches have been shown in the Figures, it is to be understood that mechanical relays, solid state switches or other devices could be used within the spirit of the invention.

I claim:

1. A switching circuit, comprising first and second input terminals, first and second output terminals, switch means comprising a pair of switch elements extending from a common node and together operable selectively in a first position interconnecting said first input terminal and first output terminal and in a second position interconnecting said second input terminal and second output terminal, open circuit leakage resistances being inherent between neighboring pairs of said first and second input and output terminals of said switch means, and means for coupling a signal on said first input terminal to said second input and second output terminals to eliminate loading of said first and second input and output terminals of said switching circuit by establishing equipotentials on opposite ends of said leakage resistances.

2. The switching circuit of claim 1, wherein said coupling means includes a buffer amplifier connected between said first input terminal and said second input and output terminals.

3. The switching circuit of claim 2, wherein said switch means includes a two pole-double throw switch.

4. the switching circuit of claim 3, wherein said switch means is electromagnetic coil operated.

5. A component scanner circuit, comprising a signal source, switching means for applying said signal source across preselected means for applying said signal source across preselected ones of a plurality of circuit components with a preselected polarity, and means for measuring a response by said preselected one of said circuit components;

said switching means comprising a plurality of switches, each of said switches comprising first and second input terminals, first and second output terminals, said switches each comprising a pair of switch elements extending from a common node and operable selectively in a first position interconnecting said first input terminal and said first output terminal and in a second position interconnecting said second input terminal and said second output terminal, open circuit leakage resistance being inherent between neighboring pairs of said first and second input and output terminals of said switch element, and buffer amplifier means for coupling a signal on said first input terminal to said second input and output terminals to eliminate loading of said first and second input and output terminals of said switch by establishing equipotentials on opposite ends of said leakage resistances.

6. The scanner circuit of claim 5, wherein each said elements includes a two-pole double throw switch.

7. The scanner circuit of claim 6, wherein said switch element is electromagnetic coil operated.

8. The scanner circuit of claim 5, wherein said switching means includes separate signal and measurement lines between said source and said components, and said switching means includes switch element pairs respectively in said signal and measurement lines.

* * * * *